US010263325B2

(12) United States Patent
Wu et al.

(10) Patent No.: US 10,263,325 B2
(45) Date of Patent: Apr. 16, 2019

(54) MODULARIZED FEED ARRAY ARRANGEMENT

(71) Applicant: Space Systems/Loral, LLC, Palo Alto, CA (US)

(72) Inventors: Gordon Wu, Sunnyvale, CA (US); Matthew Stephen Parman, Mountain View, CA (US); Robert Jones, Union City, CA (US); Philip Alley, Mountain View, CA (US); Jonathan Dirrenberger, San Francisco, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 0 days.

(21) Appl. No.: 15/831,258

(22) Filed: Dec. 4, 2017

(65) Prior Publication Data

US 2018/0301800 A1    Oct. 18, 2018

Related U.S. Application Data

(60) Provisional application No. 62/486,123, filed on Apr. 17, 2017.

(51) Int. Cl.
*H04W 4/00* (2018.01)
*H01Q 1/50* (2006.01)
(Continued)

(52) U.S. Cl.
CPC ............ *H01Q 1/50* (2013.01); *H01Q 1/288* (2013.01); *H01Q 13/02* (2013.01); *H01Q 19/10* (2013.01);
(Continued)

(58) Field of Classification Search
CPC ............. H04B 7/18513; H04B 7/0617; H04B 7/18517; H04B 7/18508; H04B 7/18534
(Continued)

(56) References Cited

U.S. PATENT DOCUMENTS 5,422,647 A * 6/1995 Hirshfield ............. H01Q 1/288
342/354
6,362,780 B1   3/2002 Butz et al.
(Continued)

FOREIGN PATENT DOCUMENTS

CN        105305075 A    3/2016

OTHER PUBLICATIONS

Extended European Search Report dated Jul. 27, 2018 in EP Application No. 18164073.1.

*Primary Examiner* — Tu X Nguyen
(74) *Attorney, Agent, or Firm* — Weaver Austin Villeneuve & Sampson LLP

(57) ABSTRACT

A modularized feed array arrangement includes a plurality of radio frequency (RF) radiating elements, a plurality of waveguides positioned inboard of the plurality of RF radiating elements, each RF radiating element being electrically coupled with an outboard portion of one or more of the waveguides; and a plurality of modules, each module including a plurality of RF switches, a plurality of amplifiers, and a manifold panel that includes a plurality of RF choke joints. An inboard portion of each RF switch is electrically coupled with a respective amplifier. Each RF choke joint includes a proximal portion electrically coupled with an outboard portion of a respective one of the RF switches and a distal portion electrically coupled with an inboard portion of a respective one of the waveguides.

20 Claims, 7 Drawing Sheets

(51) Int. Cl.
  *H01Q 1/28*    (2006.01)
  *H01Q 19/10*   (2006.01)
  *H03F 3/19*    (2006.01)
  *H01Q 21/00*   (2006.01)
  *H04B 7/185*   (2006.01)
  *H03F 3/24*    (2006.01)
  *H01Q 13/02*   (2006.01)

(52) U.S. Cl.
  CPC ........... *H01Q 21/0025* (2013.01); *H03F 3/19* (2013.01); *H03F 3/245* (2013.01); *H04B 7/18515* (2013.01); *H03F 2200/294* (2013.01); *H03F 2200/447* (2013.01); *H03F 2200/451* (2013.01)

(58) Field of Classification Search
  USPC .................................. 455/427, 12.1, 98, 25
  See application file for complete search history.

(56) References Cited

U.S. PATENT DOCUMENTS

| | | |
|---|---|---|
| 7,551,136 B1 | 6/2009 | Kalian et al. |
| 8,604,989 B1 | 12/2013 | Olsen et al. |
| 2003/0189515 A1 | 10/2003 | Jacomb-Hood et al. |
| 2005/0110681 A1 | 5/2005 | Londre |
| 2008/0150832 A1* | 6/2008 | Ingram .................... H01Q 3/26 343/893 |
| 2014/0320366 A1 | 10/2014 | Urcia et al. |
| 2015/0295640 A1* | 10/2015 | Burr ..................... H04B 7/2041 342/354 |
| 2017/0077610 A1 | 3/2017 | Bongard et al. |

* cited by examiner

MODULARIZED FEED ARRAY ARRANGEMENT

CROSS-REFERENCE TO RELATED APPLICATIONS

This disclosure claims priority to U.S. Provisional Patent Application No. 62/486,123, filed Apr. 17, 2017, entitled "SINGLE FEED PER BEAM ARRAY MECHANICAL DESIGN METHODS", and assigned to the assignee hereof, the disclosure of which in hereby incorporated by reference in its entirety into this patent application for all purposes.

TECHNICAL FIELD

The present disclosure relates generally to satellite antennas, and particularly to a modularized feed array arrangement for a high throughput satellite payload.

BACKGROUND

The assignee of the present invention manufactures and deploys spacecraft for, inter alia, communications and broadcast services. Market demands for such spacecraft have imposed increasingly stringent requirements on spacecraft payloads. For example, broadband service providers desire spacecraft with increased data rate capacity at higher EIRP through each of an increased number of user spot beans operable from geosynchronous orbit altitudes in communication with small (<1 meter aperture) user terminals.

The manufacture and repair of feed arrays for such spacecraft present a number of challenges. By way of example, since many components of conventional feed arrays are highly integrated, it is typically difficult to remove components from conventional feed arrays. Due to testing sensitivity of components within feed arrays, some disassembly and repair work may be needed in severely limited areas of access for repairing conventional feed arrays. Furthermore, due to the integration of components of conventional feed arrays, sequential installation of components is often necessary during manufacture of conventional feed arrays.

Traditionally, in order to allow rework-ability of conventional feed arrays, components are often mechanically tied together and spaced far apart. Such placement and mechanical tying add both support mass and volume. Therefore, it can be challenging to manufacture a high capacity feed array that is relatively compact and low mass using existing techniques.

As such, improved techniques for implementing feed arrays with modular components are desirable.

SUMMARY

The systems, methods and devices of this disclosure each have several innovative aspects, no single one of which is solely responsible for the desirable attributes disclosed herein.

According to some implementations, an apparatus includes a modularized feed array arrangement, the feed array arrangement including a plurality of radio frequency (RF) radiating elements, a plurality of waveguides positioned inboard of the plurality of RF radiating elements, each RF radiating element being electrically coupled with an outboard portion of one or more of the waveguides, and a plurality of modules, each module including a plurality of RF switches, a plurality of amplifiers, and a manifold panel that includes a plurality of RF choke joints. An inboard portion of each RF switch is electrically coupled with a respective amplifier and each RF choke joint includes a proximal portion electrically coupled with an outboard portion of a respective one of the RF switches and a distal portion electrically coupled with an inboard portion of a respective one of the waveguides.

In some examples, each module may be electrically independent from each other module.

In some examples, at least one module may be mechanically independent from each other module.

In some examples, at least one module may include one or more heat pipes thermally coupled with at least one of the plurality of amplifiers.

In some examples, the plurality of amplifiers may include one or more of a low noise amplifier (LNA) of a receiver and a solid state power amplifier (SSPA) of a transmitter.

In some examples, at least one module may include a plurality of spare amplifiers.

In some examples, the manifold panel of each module may be detachably coupled with a respective subset of the waveguides.

In some examples, at least one module may include a transmitter and at least one module includes a receiver and at least one RF radiating element may be electrically coupled with both the transmitter and the receiver.

In some examples, each of the plurality of RF radiating elements may be associated with exactly one respective directed RF beam.

In some examples, each of a plurality of directed RF beams may be associated with a respective single one of the plurality of RF radiating elements.

In some examples, the feed array arrangement may be assembled by fabricating the plurality of modules and mechanically coupling the plurality of fabricated modules with a structural panel by attaching an outboard surface of each manifold panel to an inboard surface of the structural panel and attaching the outboard surface of each manifold panel to the inboard surface of the structural panel may include electrically coupling the distal portion of each RF choke joint with the inboard portion of a respective one of a plurality of waveguides.

According to some implementations, a spacecraft includes an antenna reflector and a modularized feed array arrangement, the feed array arrangement including a plurality of radio frequency (RF) radiating elements, a plurality of waveguides positioned inboard of the plurality of RF radiating elements, each RF radiating element being electrically coupled with an outboard portion of one or more of the waveguides, and a plurality of modules, each module including a plurality of RF switches, a plurality of amplifiers, and a manifold panel that includes a plurality of RF choke joints. An inboard portion of each RF switch is electrically coupled with a respective amplifier and each RF choke joint includes a proximal portion electrically coupled with an outboard portion of a respective one of the RF switches and a distal portion electrically coupled with an inboard portion of a respective one of the waveguides.

In some examples, at least one module may include one or more heat pipes thermally coupled with at least one of the plurality of amplifiers.

In some examples, the manifold panel of each module may be detachably coupled with a respective subset of the waveguides.

In some examples, each of the plurality of RF radiating elements may be associated with exactly one respective directed RF beam.

In some examples, each of a plurality of directed RF beams may be associated with a respective single one of the plurality of RF radiating elements.

According to some implementations, a method includes fabricating a plurality of modules, each module including a plurality of RF switches, a plurality of amplifiers, and a manifold panel that includes a plurality of RF choke joints and mechanically coupling the plurality of fabricated modules with a structural panel by attaching an outboard surface of each manifold panel to an inboard surface of the structural panel. An inboard portion of each RF switch is electrically coupled with a respective amplifier, each RF choke joint includes a proximal portion electrically coupled with an outboard portion of a respective one of the RF switches, and attaching the outboard surface of each manifold panel to the inboard surface of the structural panel includes electrically coupling a distal portion of each RF choke joint with an inboard portion of a respective one of a plurality of waveguides.

In some examples, an outboard portion of each of the plurality of waveguides may be electrically coupled with a respective RF radiating element.

In some examples, each of the plurality of RF radiating elements may be associated with exactly one respective directed RF beam.

In some examples, each of a plurality of directed RF beams may be associated with a respective single one of the plurality of RF radiating elements.

BRIEF DESCRIPTION OF THE DRAWINGS

Features of the invention are more fully disclosed in the following detailed description of the preferred embodiments, reference being had to the accompanying drawings, in which.

Figure 1:
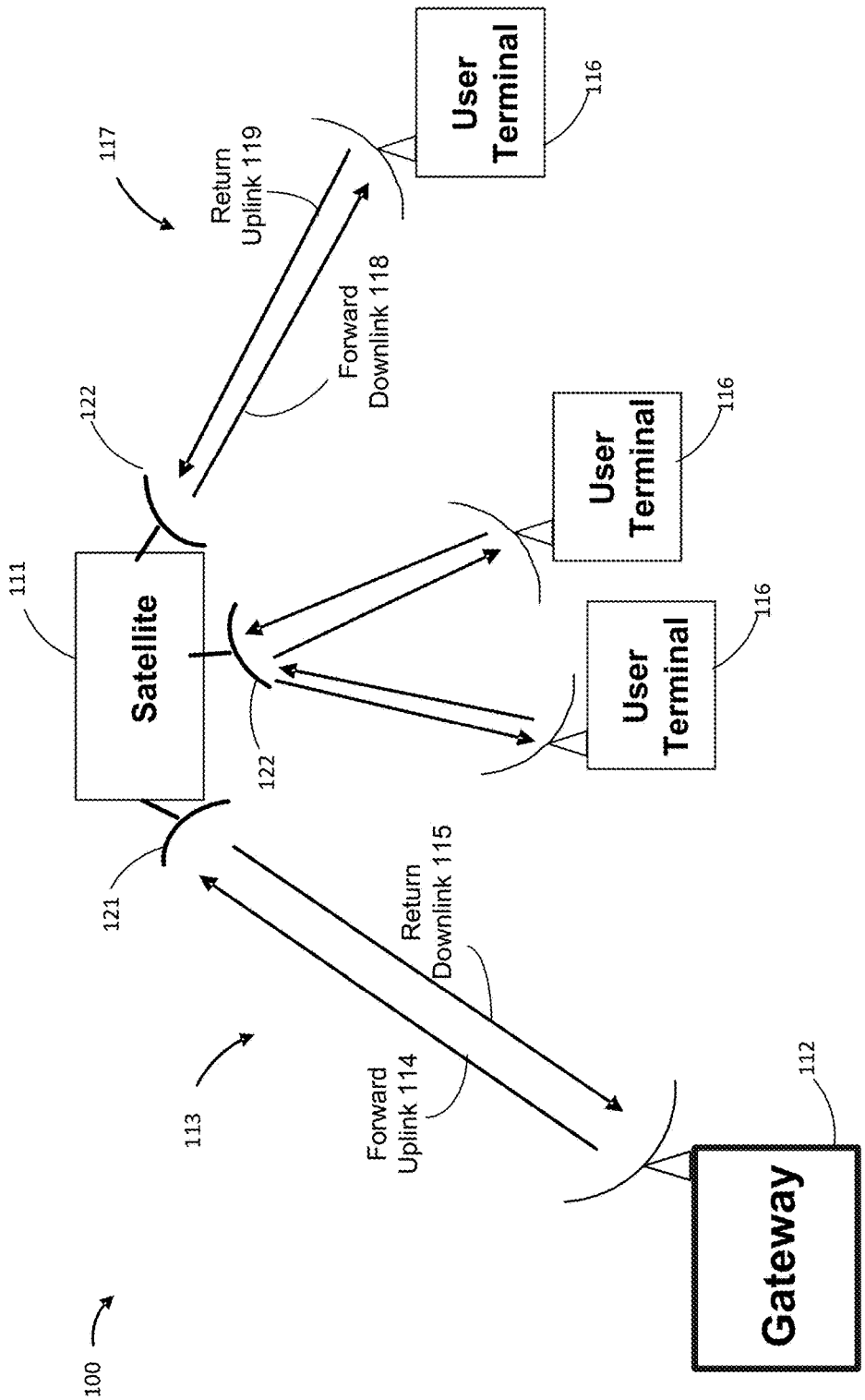
FIG. 1 illustrates a simplified diagram of a satellite communications network, in accordance with some implementations.

Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the subject invention as defined by the appended claims.

DETAILED DESCRIPTION

Specific exemplary embodiments of the invention will now be described with reference to the accompanying drawings. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when a feature is referred to as being "connected" or "coupled" to another feature, it can be directly connected or coupled to the other feature, or intervening features may be present. Furthermore, "connected" or "coupled" as used herein may include wirelessly connected or coupled. It will be understood that although the terms "first" and "second" are used herein to describe various features, these features should not be limited by these terms. These terms are used only to distinguish one feature from another feature. Thus, for example, a first user terminal could be termed a second user terminal, and similarly, a second user terminal may be termed a first user terminal without departing from the teachings of the present invention. As used herein, the term "and/or" includes any and all combinations of one or more of the associated listed items. The symbol "/" is also used as a shorthand notation for "and/or".

The terms "spacecraft", "satellite" and "vehicle" may be used interchangeably herein, and generally refer to any orbiting satellite or spacecraft system.

Embodiments disclosed hereinbelow include significant improvements to a spacecraft feed array. As described above, in the absence of the presently disclosed techniques, conventional feed arrays may be difficult to repair and manufacture and may have excess mass and volume. In contrast to conventional, non-modular, feed arrays, some of the feed arrays disclosed herein may be more easily removed and replaced for repair, reconfigured for different coverages power requirements and/or data rates, and installed in parallel rather than sequentially.

Referring to FIG. 1, a simplified diagram of a satellite communications network 100 is illustrated. The network includes a satellite 111, which may be located, for example, at a geostationary orbital location or in low earth orbit. Satellite 111 may be communicatively coupled, via at least one feeder link antenna 121, to at least one gateway 112 and, via at least one user link antenna 122 to a plurality of user terminals 116. The at least one gateway 112 may be coupled to a network such as, for example, the Internet. Each gateway 112 and the satellite 111 communicate over a feeder link 113, which has both a forward uplink 114 and a return downlink 115. User terminals 116 and the satellite 111 communicate over a user link 117 that has both a forward downlink 118 and a return uplink 119. User link 117 and the feeder link may operate in respective assigned frequency bands, referred to herein as the "user link band" and the "feeder link band".

Figure 2:
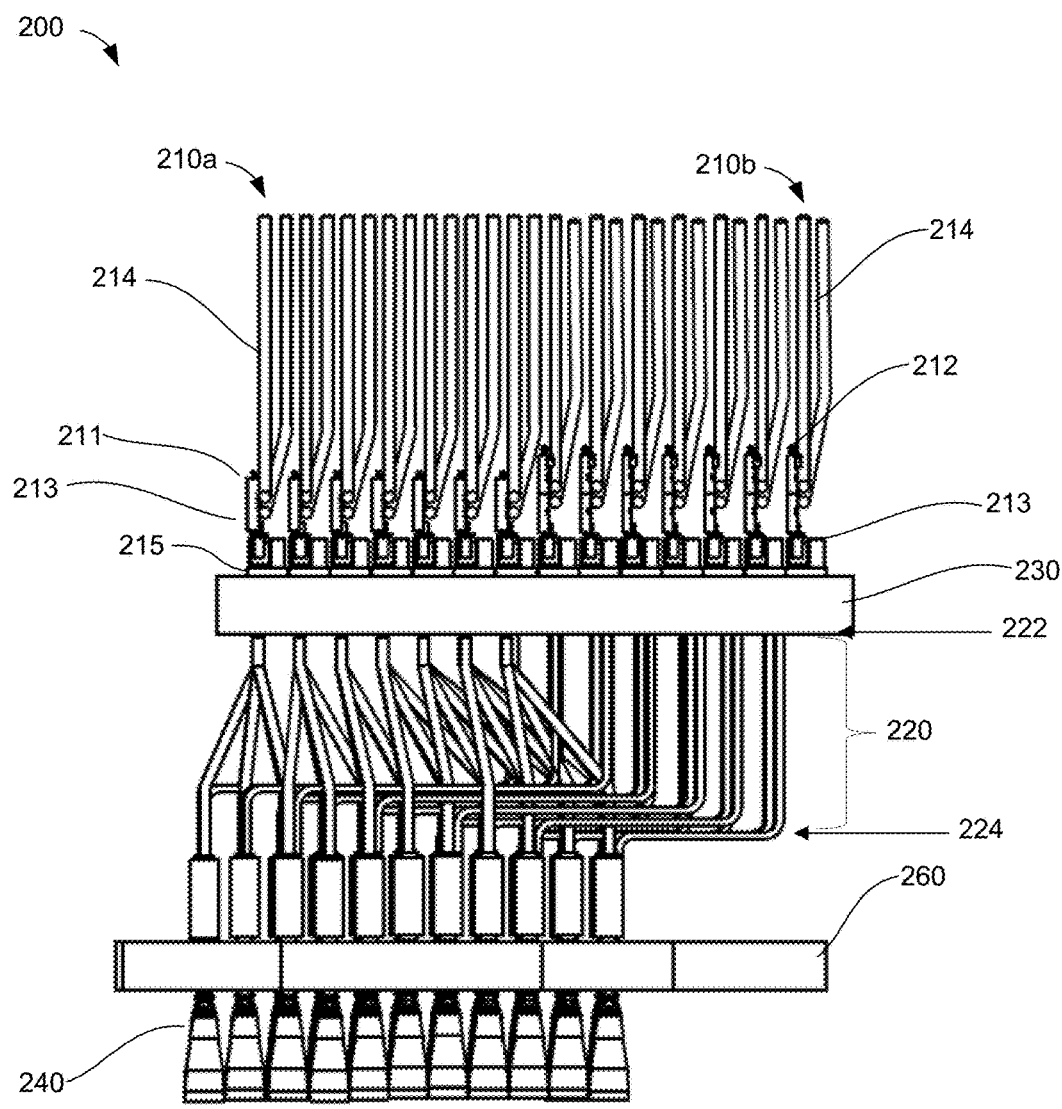
FIG. 2 illustrates a side view of an example of a feed array arrangement, in accordance with an implementation.

FIG. 2 illustrates an example of a modularized feed array arrangement, according to an implementation. In the illustrated implementation, the feed array arrangement 200 includes seven modules 210a and seven modules 210b. Each module 210a includes transmitters 211, radio frequency (RF) switches 213, and heat pipes 214. Each module 210b includes receivers 212, RF switches 213, and heat pipes 214.

In some implementations, the RF switches 213 may be mechanical switches such as c-switches. The heat pipes 214 may be thermally coupled with the amplifiers of transmitters 211 and/or receivers 212, and may be configured to transport heat from the amplifiers to one or more radiators (not shown) of a spacecraft that includes the feed array arrangement 200. For example, a receiver 212 may include a low noise amplifier (LNA) that is thermally coupled with a respective heat pipe 214. Similarly, a transmitter 211 may include a solid state power amplifier (SSPA) that is thermally coupled with another respective heat pipe 214.

In the illustrated implementation, the feed array arrangement 200 includes seven modules 210a and seven modules 210b, and each module has two heat pipes 214, but it will be appreciated that the feed array arrangements disclosed herein may have any number of modules, and that each module may include any number of heat pipes, RF switches, transmitters, and/or receivers.

In the illustrated implementation, the feed array arrangement 200 includes waveguides 220 with which modules 210a and 210b may be mechanically and electrically coupled. More particularly, in the illustrated implementation, an inboard portion 222 of each waveguide 220 may include a port configured to be electrically coupled with a respective one of the RF switches 213 by way of a respective RF choke joint. More particularly, a manifold panel 215 may include the respective RF choke joints. In some implementations, each RF choke joint of the manifold panel 215 may be configured to interface with a respective RF switch 213. Each RF choke joint may be configured to provide an electrical coupling between a waveguide 220 and a respective switch 213. Advantageously, the electrical coupling may exhibit very little power loss. In the illustrated implementation, the manifold panel 215 is mechanically coupled with a first structural panel 230. Advantageously, a mechanical coupling between the manifold panel 215 and the first structural panel 230 may be configured to facilitate easy installation and/or removal of the modules 210.

In the illustrated implementation, the feed array arrangement 200 includes radiating elements 240 which are electrically coupled with an outboard portion 224 of waveguides 220 and are mechanically secured by a second structural panel 260. Radiating elements 240 may be configured as circular or square feed horns, for example. In some implementations, the feed array arrangement 200 may be configured to illuminate an antenna reflector of a spacecraft. The feed array arrangement 200 may be configured to transmit and/or receive RF signals by way of a multi-beam antenna pattern. In some implementations, each of a plurality of directed RF beams is associated with a single radiating element and/or each radiating element is associated with a single beam.

In some implementations, each radiating element 240 may form its own pattern on the ground. Radiating elements 240 may be electrically coupled with amplifiers integrated so as to be proximal to feed array arrangement 200 to minimize line length allowing significantly higher data rates. Correspondingly, the feed array arrangement 200 may be referred to as an "amplifier integrated feed array". Also or alternatively, the spacing of radiating elements 240 may or may not match the spacing of modules 210. In some implementations, a radiating element 240 may be electrically coupled with both of a transmitter 211 and a receiver 212.

Figure 3:
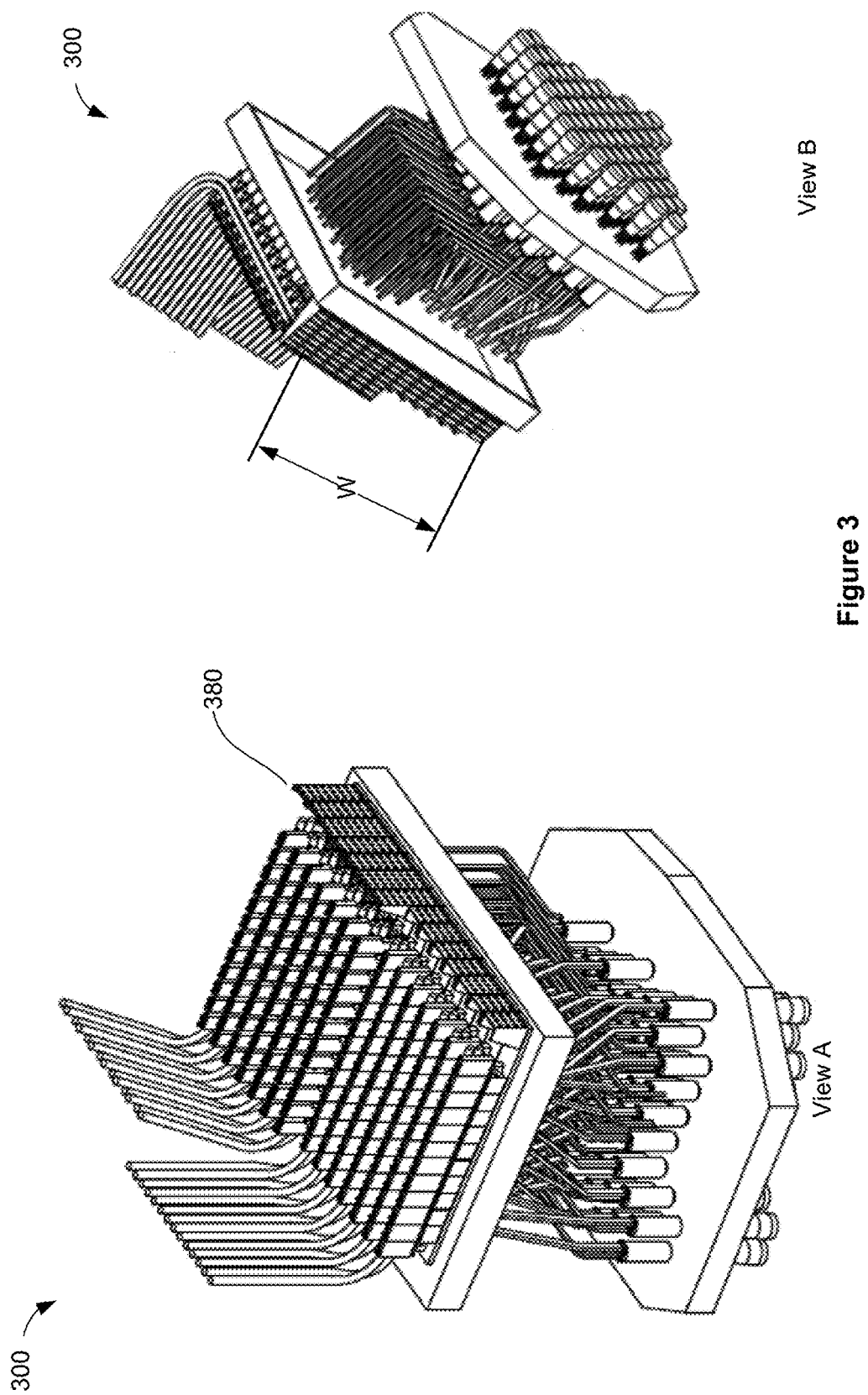
FIG. 3 illustrates isometric views, of an example of a feed array arrangement, according to an implementation.

FIG. 3 illustrates isometric views, View A and View B, of an example of a feed array arrangement 300, according to an implementation. The feed array arrangement 300 may include a similar set of components as the feed array arrangement 200 of FIG. 2. Feed array 300 also includes bulkheads 380 to allow disconnection and removal of modules, as discussed in greater detail below.

In some implementations, the feed array arrangements disclosed herein may be highly compact. For example, the present inventors have found that the example feed array 300, having 69 radiating elements may have a width, W, of roughly of 30 inches and a mass of approximately 250 kilograms.

Figure 4B:
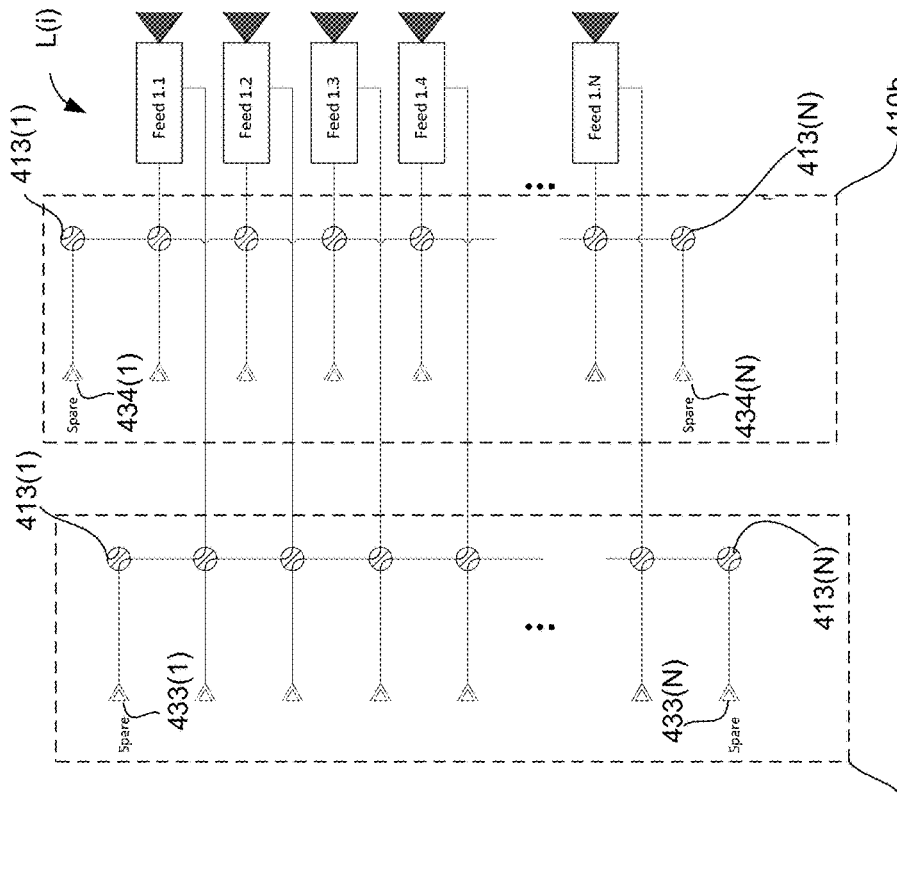
FIG. 4B illustrates a schematic diagram of layers of a feed array arrangement, in accordance with some implementations.
Figure 4A:
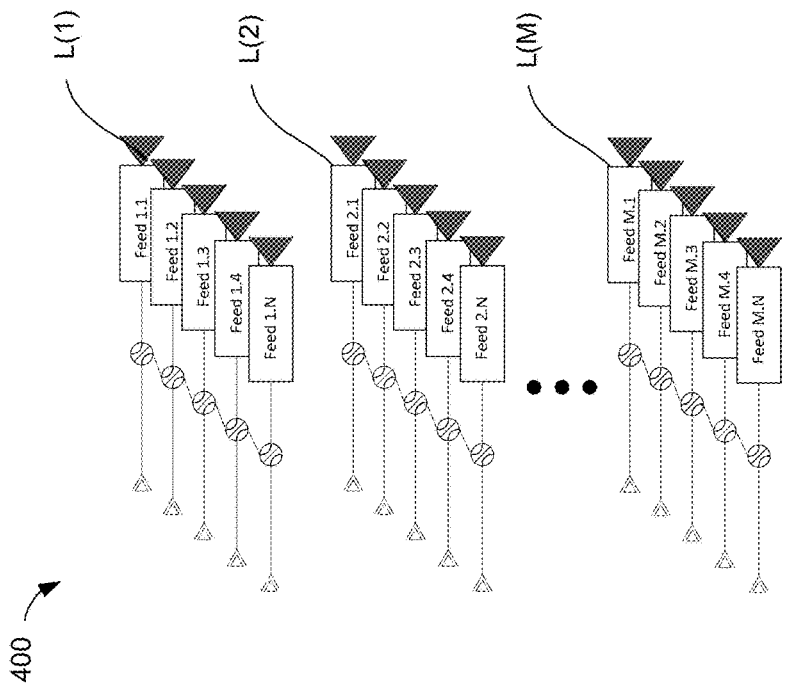
FIG. 4A illustrates a schematic diagram of a feed array arrangement, in accordance with some implementations.

FIG. 4A illustrates a schematic diagram of an M×N feed array arrangement 400, in accordance with some implementations. The depiction of feed array arrangement 400 in FIG. 4A may be a schematic representation of any feed array arrangement disclosed herein such as feed array arrangement 200 of FIG. 2 or feed array arrangement 300 of FIG. 3. For illustrative purposes, the feed array arrangement 400 is depicted s including M rows or layers, layers L(1) through L(M), each layer having N feed elements. Each layer L(i) of the feed array arrangement 400 may be configured so as to be electrically independent of all other layers. As such, each of layers L(1) through L(M) may be modified without affecting the function of the other layers.

FIG. 4B illustrates a schematic diagram of a layer L(i) of the feed array arrangement 400, in accordance with some implementations. Layer L(i) includes modules 410a and 410b. Module 410a includes amplifiers 433(1) through 433(N) and RF switches 413(1) through 413(N). Each of amplifiers 433(1) through 433(N) may be an SSPA of a transmitter. In the illustrated implementation, each module 410b includes amplifiers 434(1) through 434(N) and RF switches 413(1) through (N). Each of amplifiers 434(1) through 434(N) may be an LNA of a receiver. The depiction of modules 410a and 410b in FIG. 4B may be schematic representations of any modules disclosed herein such as modules 210a and/or 210b of FIG. 2.

To mitigate consequences of a failure of any given amplifier, module 410a and module 410b may include spare amplifiers. For example, in the illustrated implementation, where the number of amplifiers is N, the number of feed elements is N−2. In some implementations, placement of spare amplifiers may vary. By way of example, spare amplifiers need not be placed on the edges of modules, as depicted in FIG. 4B. Rather, any amplifier 413(i) may be a spare amplifier.

Since modules 410a and 410b are electrically and mechanically independent of each other and of any other modules of feed array 400, modules 410a and 410b may be easily removed from feed array 400. By way of example, module 410a may be removed from the feed array arrangement 400 and reconfigured, e.g., heat pipes (not shown in FIG. 4B) of the module 410a may be added, removed, or modified. Similarly, because modules 410a and 410b of the feed array arrangement 400 are electrically and mechanically independent of each other, they do not need to be installed sequentially during manufacture of feed array 400.

Figure 5:
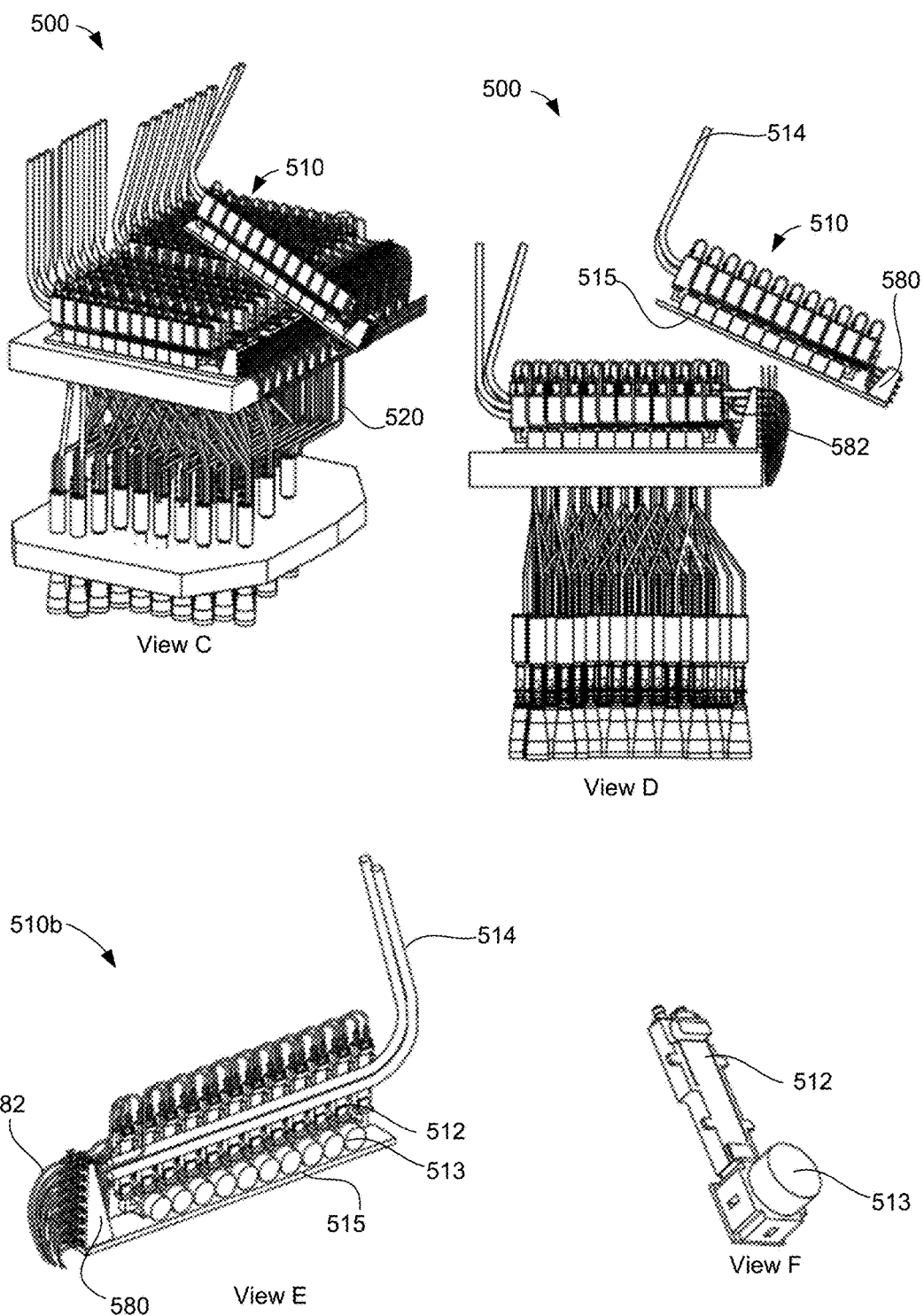
FIG. 5 illustrates an example of a feed array arrangement, according to an implementation.

As discussed above, in some implementations, the feed array arrangements may include harnesses and bulkheads to allow for easier disconnection, removal, and/or reconnection of individual modules. By way of example, FIG. 5 illustrates an isometric view (View C) and a side view (View D) of an example of a feed array arrangement 500, according to an implementation. Feed array arrangement 500 may include a similar arrangement of components as feed array 200 of FIG. 2. For example, the feed array arrangement 500 includes waveguides 520 and modules 510, each module 510 including at least one heat pipe 514 and a manifold panel 515 that includes two or more RF choke joints. Feed array arrangement 500 also includes bulkheads 580 and harnesses 582. Modules 510 may be electrically coupled with other components of the feed array arrangement 500 or a spacecraft on which the feed array arrangement 500 is disposed by way of bulkheads 580 and harnesses 582.

Referring now to View E of FIG. 5, an isometric view of a module 510b is depicted. The module 510b may be a module for any of the feed arrays disclosed herein. For example, like modules 210b of FIG. 2, the module 510b may include receivers 512, RF switches 513, and one or more heat pipes 514. As may be better observed in View F, an inboard portion of each RF switch 513 may be electrically and mechanically coupled with a respective amplifier of a receiver 512. An outboard portion of each RF switch 513 may be electrically coupled with a proximal portion of an RF choke joint 515 provided in manifold panel 515. An inboard portion of a waveguide, such as one of waveguides 520, may be electrically coupled with a respective one of RF switches 513 by way of a distal portion of the choke joint.

Figure 6:
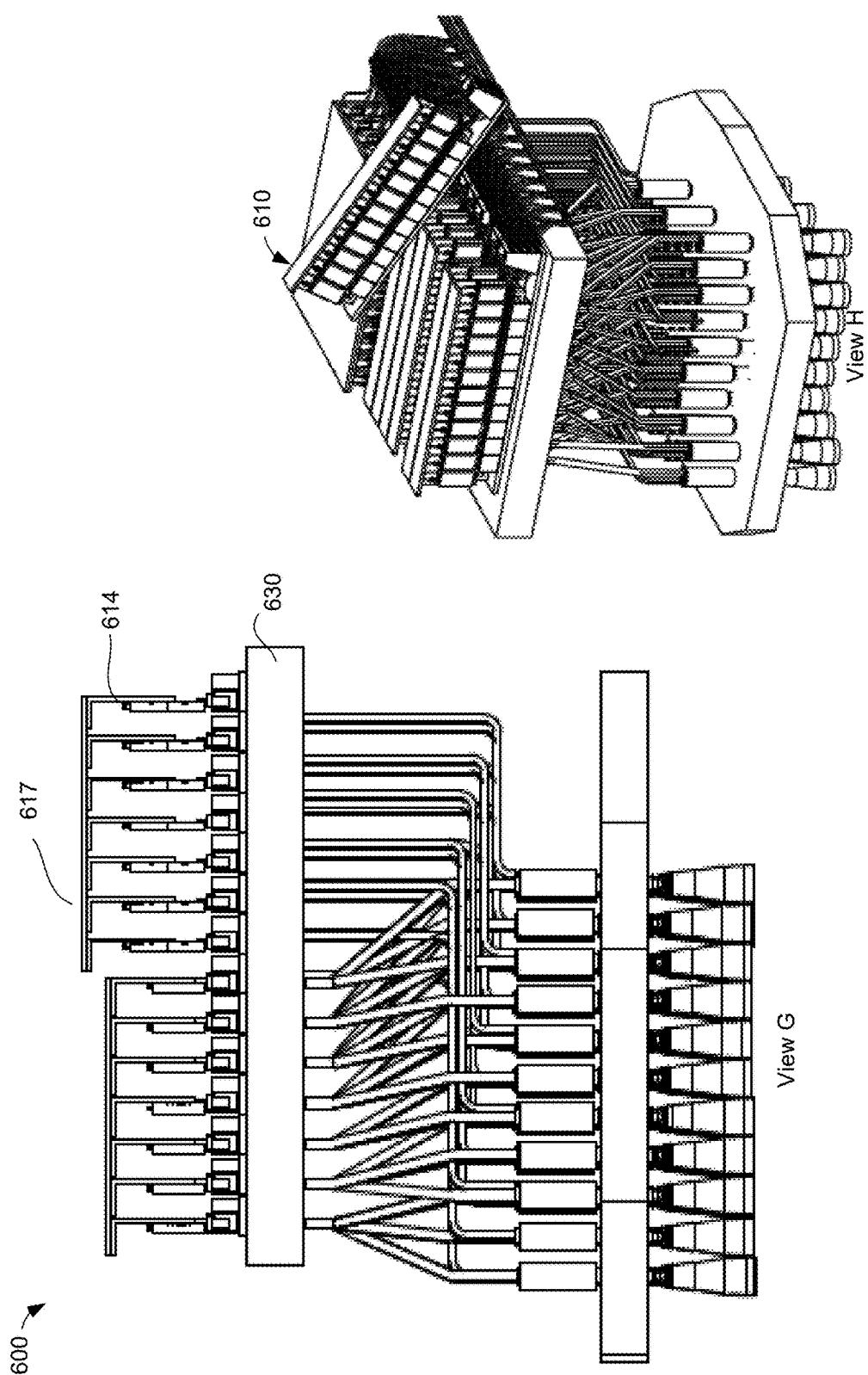
FIG. 6 illustrates a feed array arrangement that includes a relatively compact arrangement of heat pipes, according to another implementation.

The heat pipes 514 may be configured, as illustrated in FIG. 5, to transport heat relatively long distances (>one meter). The heat pipes 514 may be, for example, constant conductance heat pipes (CCHP) and may be configured to transport heat from the feed array arrangement 500 to a radiator panel located a substantial distance away from the feed array arrangement 500. FIG. 6 illustrates a feed array arrangement 600 that includes a relatively compact arrangement of heat pipes 614. The heat pipes 614, advantageously, may be configured as oscillating heat pipes (OHP). In the illustrated implementation a plurality of L-shaped heat pipes 614, are thermally coupled by a heat pipe 617. As may be better observed in View H, a module 610, that includes heat pipes 614 and the heat pipe 617 may be detachably coupled with a structural panel 630.

Figure 7:
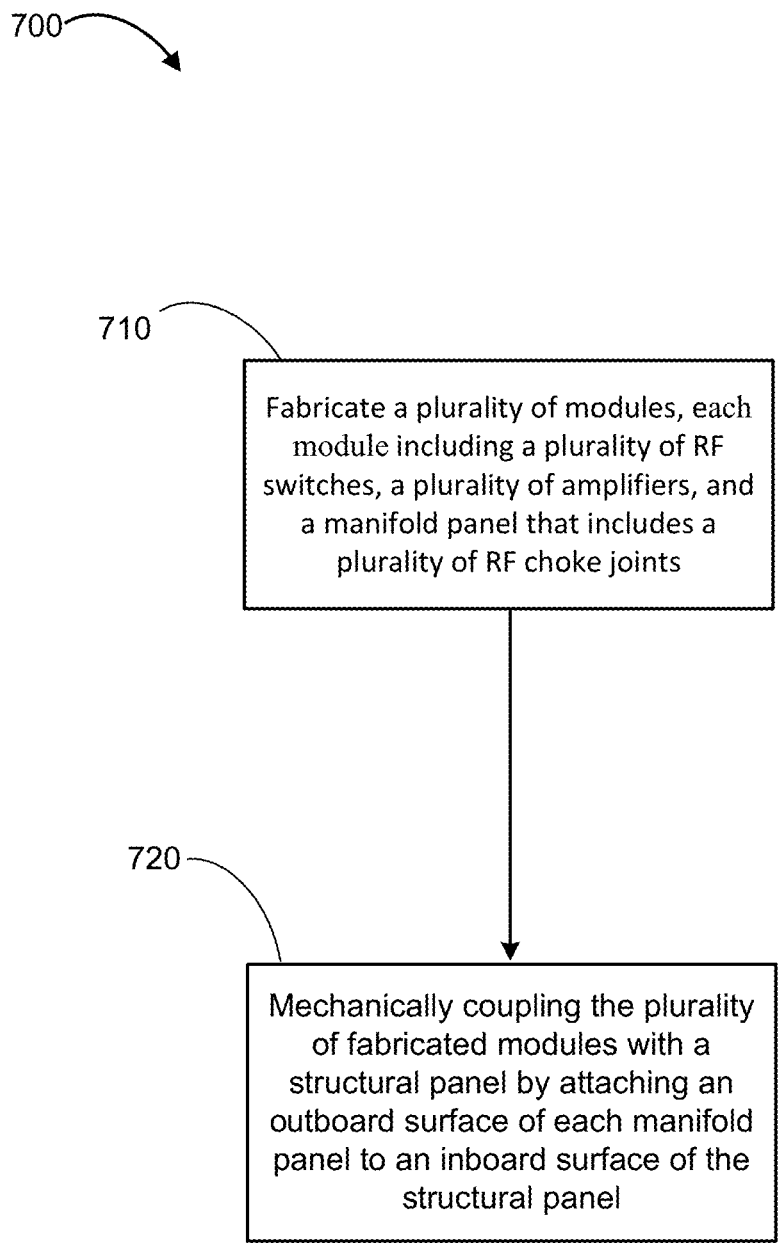
FIG. 7 illustrates a process flow diagram for assembling a modularized feed array arrangement, according to an implementation.

FIG. 7 illustrates a process flow diagram for assembling a modularized feed array arrangement, according to an implementation. As described hereinabove, the feed array arrangement may include a plurality of radio frequency (RF) radiating elements, a plurality of waveguides positioned inboard of the plurality of RF radiating elements, each RF radiating element being electrically coupled with an outboard portion of one or more of the waveguides and a plurality of modules, each module including a plurality of RF switches, a plurality of amplifiers, and a manifold panel that includes a plurality of RF choke joints.

The method 700 starts, at block 710, with fabricating the plurality of modules in such manner that an inboard portion of each RF switch is electrically coupled with a respective amplifier and each RF choke joint includes a proximal portion electrically coupled with an outboard portion of a respective one of the RF switches.

At block 720 the plurality of fabricated modules may be mechanically coupled with a structural panel by attaching an outboard surface of each manifold panel to an inboard surface of the structural panel. Attaching the outboard surface of each manifold panel to the inboard surface of the structural panel may include electrically coupling a distal portion of each RF choke joint with an inboard portion of a respective one of a plurality of waveguides.

Thus, a modularized feed array arrangement has been described. The foregoing merely illustrates principles of the invention. It will thus be appreciated that those skilled in the art will be able to devise numerous systems and methods which, although not explicitly shown or described herein, embody said principles of the invention and are thus within the spirit and scope of the invention as defined by the following claims.

What is claimed is:

1. An apparatus comprising:
   a modularized feed array arrangement, the feed array arrangement including:
   a plurality of radio frequency (RF) radiating elements;
   a plurality of waveguides positioned inboard of the plurality of RF radiating elements, each RF radiating element being electrically coupled with an outboard portion of one or more of the waveguides; and
   a plurality of modules, each module including a plurality of RF switches, a plurality of amplifiers, and a manifold panel that includes a plurality of RF choke joints; wherein:
   an inboard portion of each RF switch is electrically coupled with a respective amplifier; and
   each RF choke joint includes a proximal portion electrically coupled with an outboard portion of a respective one of the RF switches and a distal portion electrically coupled with an inboard portion of a respective one of the waveguides.

2. The feed array arrangement of claim 1, wherein each module is electrically independent from each other module.

3. The feed array arrangement of claim 1, wherein at least one module is mechanically independent from each other module.

4. The feed array arrangement of claim 1, wherein at least one module includes one or more heat pipes thermally coupled with at least one of the plurality of amplifiers.

5. The feed array arrangement of claim 1, wherein the plurality of amplifiers includes one or more of a low noise amplifier (LNA) of a receiver and a solid state power amplifier (SSPA) of a transmitter.

6. The feed array arrangement of claim 1, wherein at least one module includes a plurality of spare amplifiers.

7. The feed array arrangement of claim 1, wherein the manifold panel of each module is detachably coupled with a respective subset of the waveguides.

8. The feed array arrangement of claim 1, wherein:
   at least one module includes a transmitter and at least one module includes a receiver; and
   at least one RF radiating element is electrically coupled with both the transmitter and the receiver.

9. The feed array arrangement of claim 1, wherein each of the plurality of RF radiating elements is associated with exactly one respective directed RF beam.

10. The feed array arrangement of claim 1, wherein each of a plurality of directed RF beams is associated with a respective single one of the plurality of RF radiating elements.

11. The feed array arrangement of claim 1, wherein:
   the feed array arrangement is assembled by fabricating the plurality of modules and mechanically coupling the plurality of fabricated modules with a structural panel by attaching an outboard surface of each manifold panel to an inboard surface of the structural panel; and
   attaching the outboard surface of each manifold panel to the inboard surface of the structural panel includes electrically coupling the distal portion of each RF choke joint with the inboard portion of a respective one of a plurality of waveguides.

12. A spacecraft comprising:
   an antenna reflector; and
   a modularized feed array arrangement, the feed array arrangement including:
   a plurality of radio frequency (RF) radiating elements;
   a plurality of waveguides positioned inboard of the plurality of RF radiating elements, each RF radiating element being electrically coupled with an outboard portion of one or more of the waveguides; and a plurality of modules, each module including a plurality of RF switches, a plurality of amplifiers, and a manifold panel that includes a plurality of RF choke joints; wherein:
an inboard portion of each RF switch is electrically coupled with a respective amplifier; and
each RF choke joint includes a proximal portion electrically coupled with an outboard portion of a respective one of the RF switches and a distal portion electrically coupled with an inboard portion of a respective one of the waveguides.

13. The spacecraft of claim 12, wherein at least one module includes one or more heat pipes thermally coupled with at least one of the plurality of amplifiers.

14. The spacecraft of claim 12, wherein the manifold panel of each module is detachably coupled with a respective subset of the waveguides.

15. The spacecraft of claim 12, wherein each of the plurality of RF radiating elements is associated with exactly one respective directed RF beam.

16. The spacecraft of claim 12, wherein each of a plurality of directed RF beams is associated with a respective single one of the plurality of RF radiating elements.

17. A method comprising
fabricating a plurality of modules, each module including a plurality of RF switches, a plurality of amplifiers, and a manifold panel that includes a plurality of RF choke joints; and
mechanically coupling the plurality of fabricated modules with a structural panel by attaching an outboard surface of each manifold panel to an inboard surface of the structural panel; wherein
an inboard portion of each RF switch is electrically coupled with a respective amplifier,
each RF choke joint includes a proximal portion electrically coupled with an outboard portion of a respective one of the RF switches; and
attaching the outboard surface of each manifold panel to the inboard surface of the structural panel includes electrically coupling a distal portion of each RF choke joint with an inboard portion of a respective one of a plurality of waveguides.

18. The method of claim 17, wherein an outboard portion of each of the plurality of waveguides is electrically coupled with a respective RF radiating element.

19. The method of claim 18, wherein each of the plurality of RF radiating elements is associated with exactly one respective directed RF beam.

20. The method of claim 18, wherein each of a plurality of directed RF beams is associated with a respective single one of the plurality of RF radiating elements.

* * * * *